US010455735B2

(12) United States Patent
Cheng

(10) Patent No.: US 10,455,735 B2
(45) Date of Patent: Oct. 22, 2019

(54) SELF-ORGANIZING THERMODYNAMIC SYSTEM

(71) Applicant: Coolanyp, LLC, Redmond, WA (US)

(72) Inventor: Peng Cheng, Redmond, WA (US)

(73) Assignee: Coolanyp, LLC, Redmond, WA (US)

(*) Notice: Subject to any disclaimer, the term of this patent is extended or adjusted under 35 U.S.C. 154(b) by 722 days.

(21) Appl. No.: 15/060,426

(22) Filed: Mar. 3, 2016

(65) Prior Publication Data
US 2017/0257982 A1    Sep. 7, 2017

(51) Int. Cl.
*H05K 7/20* (2006.01)
*F28D 15/02* (2006.01)
*G06F 1/20* (2006.01)
*H01L 23/427* (2006.01)

(52) U.S. Cl.
CPC ..... *H05K 7/20336* (2013.01); *F28D 15/0266* (2013.01); *G06F 1/20* (2013.01); *H01L 23/427* (2013.01); *H05K 7/20327* (2013.01); *H05K 7/20381* (2013.01)

(58) Field of Classification Search
CPC ........... H05K 7/20336; H05K 7/20327; H05K 7/20381; F28D 15/0266; G06F 1/20; H01L 23/427
USPC ............................................ 165/272, 104.26
See application file for complete search history.

(56) References Cited

U.S. PATENT DOCUMENTS

| | | | |
|---|---|---|---|
| 4,921,041 A | 5/1990 | Akachi | |
| 5,219,020 A | 6/1993 | Akachi | |
| 5,253,702 A * | 10/1993 | Davidson | F28D 15/0233 165/104.14 |
| 5,506,032 A * | 4/1996 | Rowe | F28D 15/0233 428/116 |
| 5,944,092 A * | 8/1999 | Van Oost | F28D 15/043 165/104.24 |
| 2001/0023757 A1 * | 9/2001 | Huang | F28D 15/0266 165/104.26 |

(Continued)

OTHER PUBLICATIONS

W. Ross Ashby, "Principles of the self-organizing system," E:CO Special Double Issue vol. 6, Nos. 1-2, 2004, pp. 102-126.

(Continued)

*Primary Examiner* — Raheena R Malik
(74) *Attorney, Agent, or Firm* — Lee & Hayes, P.C.

(57) ABSTRACT

Disclosed are thermal management for electronic devices and, more particularly, to a thermodynamic system with bi-phase fluid circuits which self-organize internal fluid movement to transfer heat from heat absorption zones to heat dissipation zones. A thermodynamic system may include a plurality of thermal energy absorption (TEA) nodes disposed adjacent to one or more heat sources which are interconnected with one another and also a plurality of thermal energy dissipation (TED) nodes through a capillary system that encloses a bi-phase fluid. As TE is absorbed into the bi-phase fluid at individual TEA nodes local condition changes such as, for example, pressure and/or volume increases induce convection of the absorbed TE away from the individual TEA nodes. As TE dissipates from the bi-phase fluid at individual TED nodes local condition changes such as, for example, pressure and/or volume decreases further induce convection of additional absorbed TE toward the individual TED nodes.

20 Claims, 12 Drawing Sheets

(56) References Cited

U.S. PATENT DOCUMENTS

| | | | |
|---|---|---|---|
| 2003/0051857 A1* | 3/2003 | Cluzet | B64G 1/503 165/41 |
| 2003/0192669 A1 | 10/2003 | Wu | |
| 2010/0089553 A1 | 4/2010 | Yang | |
| 2010/0122804 A1* | 5/2010 | Yang | F28D 21/00 165/164 |
| 2011/0036538 A1 | 2/2011 | Brunschwiler et al. | |
| 2011/0209864 A1* | 9/2011 | Figus | F28D 15/0275 165/287 |
| 2013/0133871 A1* | 5/2013 | Ma | F28D 15/0266 165/185 |
| 2015/0060020 A1* | 3/2015 | Yang | F28D 15/04 165/104.26 |
| 2015/0068703 A1* | 3/2015 | de Bock | B64D 13/00 165/41 |
| 2015/0276322 A1* | 10/2015 | Bolin | F28D 15/0266 165/104.21 |

OTHER PUBLICATIONS

Bak, et al., "Self-Organized Criticality: An Explanation of 1/f Noise," Physical Review Letters, The American Physical Society, vol. 59, No. 4, Jul. 27, 1987, pp. 381-384.

Cheng, et al., "A Mathematical Model of an Oscillating Heat Pipe," Heat Transfer Engineering, , vol. 32, Issue 11-12, (2011), pp. 1037-1046. Also available at: http://dx.doi.org/10.1080/01457632.2011.556495.

Cheng, et al., "An Investigation of Flat-Plate Oscillating Heat Pipes," Journal of Electronic Packaging, ASME, 041009-6, vol. 132, Dec. 2010, 6 pages.

Gershenson, et al., "When Can We Call a System Self-Organizing?", Advances in Artificial Life, published Sep. 14, 2003, 8 pages.

Donald T. Jacobs, Resource Letter SOP-1I Self-Organizing Physics, American Association of Physics Teachers, American Journal of Physics, vol. 83, No. 8, Aug. 2015), pp. 680-687. Also available http://dx.doi.org/10.1119/1.4922338.

Khan, et al., "Convergence Analysis of a New Self Organizing Map Based Optimization (SOMO) Algorithm," Cognitive Computation, Aug. 2015, vol. 7, Issue 4, pp. 477-486.

Ma, et al., "Heat Transport Capability in an Oscillating Heat Pipe," Journal of Heat Transfer, ASME, vol. 130 / 08501-3, Aug. 2008, pp. 081501-1 through 081501-7.

Nino, et al., "Characterization of Two-Phase Flow in Microchannels, Air Conditioning and Refrigeration Center," a National Science Foundation/University Cooperative Research Center, University of Illinoi at Urbana-Champaign, ACRC TR-202, Oct. 2002, 110 pages.

Rajmohan Rajaraman, "Introduction to Dynamic Networks Models, Algorithms, and Analysis", Dynamo Training School, Lisbon, Portugal, Jun. 28-Jul. 1, 2006, 77 pages.

E.V. Rebrov, "Two-Phase Flow Regimes in Microchannels", Theoretical Foundations of Chemical Engineering, ISSN 0040-5795,, 2010, vol. 44, No. 4, pp. 355-367.

Teng, et al., "Fluid Dynamics in Microchannels," Fluid Dynamics, Computational Modeling and Applications, Dr. L. Hector Juarez (Ed.), ISBN: 978-953-51-0052-2, InTech, (2012), pp. 403-437. Also available from: http://www.intechopen.com/books/fluid-dynamicscomputational-modeling-and-applications/fluid-dynamics-in-microchannels.

Thompson, et al., "An experimental investigation of a three-dimensional flat-plate oscillating heat pipe with staggered microchannels,", Intenrational Journal of Heat and Mass Transfer, 54 (2011), pp. 3951-3959.

PCT Search Report and Written Opinion dated May 25, 2017 for PCT Application No. PCT/US17/19130, 10 pages.

* cited by examiner

SECTION A-A

SECTION B-B

SECTION C-C

SECTION D-D

US 10,455,735 B2

SELF-ORGANIZING THERMODYNAMIC SYSTEM

FIELD OF THE DISCLOSURE

This disclosure relates generally to thermal management for but not limited to electronic devices and, more particularly, to a thermodynamic system with bi-phase fluid circuits which self-organize internal fluid movement to transfer heat from heat absorption zones to heat dissipation zones.

BACKGROUND

Advancements to thermal management technologies will continue to be critical to the continued development of high performance microelectronic devices. For example, each of the applications of super computers, avionic electronics, and mobile electronics could benefit from advancements in the effectiveness and/or efficiencies of thermal management systems. In this regard, the duel pursuit of both more compact packaging of electronics as well as increase computing power and functionality has in many instances resulted in an increased thermal energy generation per unit volume. As a result, it has been challenging to effectively manage this increase thermal energy (TE). Furthermore, excessive heat buildup near computing components can result in component failure which, depending on the application, may range in severity from a mere nuisance to a life threatening situation.

Therefore, thermal management solutions will continue to be of great importance in continuing the pursuit of smaller and more computationally powerful microelectronic devices. Resultantly, new approaches to increasing one or both of an effectiveness or an efficiency of thermal management while also being configured toward the scale of microelectronics are desirable.

BRIEF DESCRIPTION OF THE DRAWINGS

The detailed description is described with reference to the accompanying figures. The same reference numbers in different figures indicate similar or identical items.

DETAILED DESCRIPTION

This disclosure provides thermodynamic systems, apparatuses, and methods for dissipating thermal energy (TE) from one or more TE absorption (TEA) zones to one or more thermal energy dissipation (TED) zones through a closed fluid circuit enclosing a bi-phase fluid. It is an object of the present disclosure to enable highly efficient heat transfer from a plurality of TEA nodes to a plurality of TED nodes in a self-organized manner based on local conditions (e.g. temperature, pressure, bi-phase liquid state, etc.) of individual ones of the TEA and/or dissipation nodes. Embodiments of the present disclosure ensure the thermodynamic system to be critically self-organized via fractioning TEA and TED zones into multiple subzones represented by TEA and TED nodes interconnecting the nodes via networked capillary system to enable both mass and energy communications. For example, with reference to FIG. 1, each of the TEA and TED zones include a plurality of nodes which are each "fractioned" from the other nodes in the same zone, e.g. no node is connected to another node within the same zone. Embodiments of the present disclosure leverage capillary action within the closed fluid-circuit to nearly eliminate gravitational effects with respect to mass flow of the bi-phase fluid between nodes. Further objects and advantages of the presently disclosed systems, apparatuses, and methods are discussed throughout the disclosure.

Figure 1:
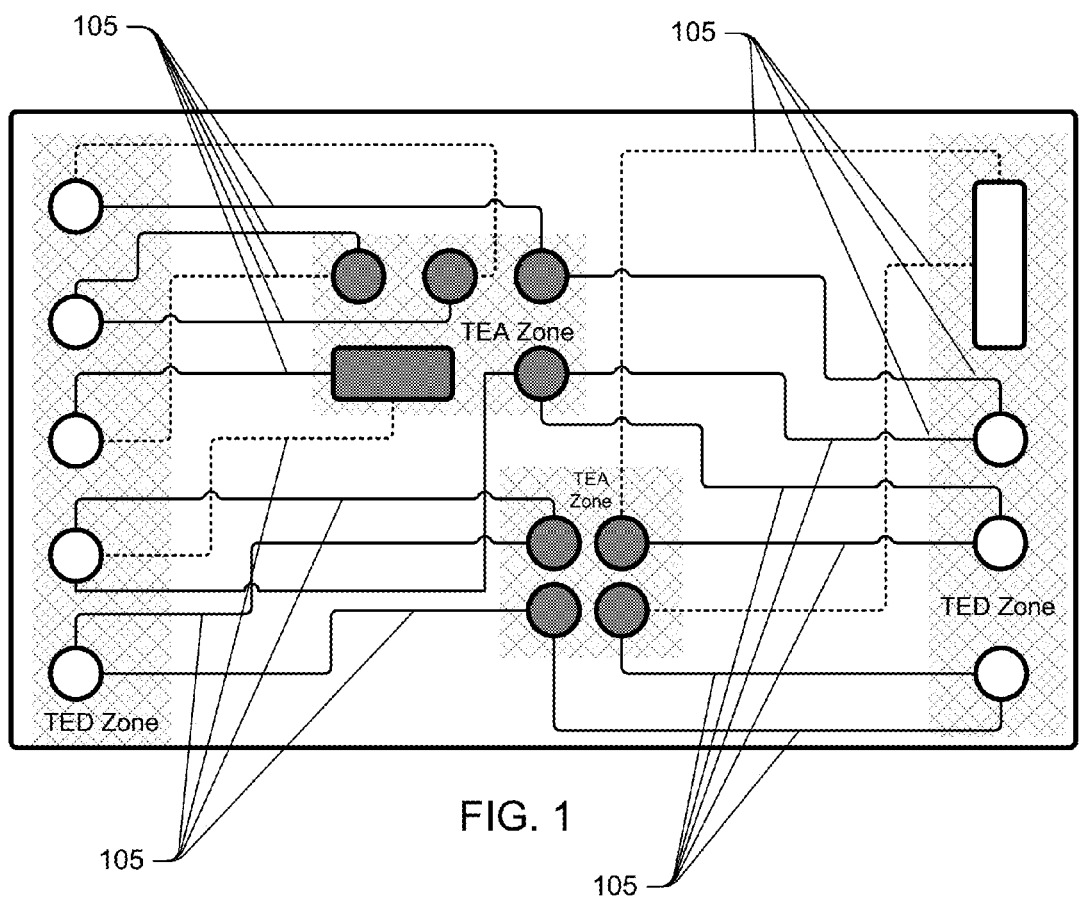
FIG. 1 illustrates a schematic of an example thermodynamic circuit that includes a plurality of interconnected thermal energy absorption (TEA) nodes and TE dissipation (TED) nodes according to some embodiments.

FIG. 1 illustrates a schematic of a thermodynamic system 100 for transferring TE from one or more TEA zones at which TE is absorbed into a closed fluid circuit to one or more TED zones at which TE is dissipated out of the closed fluid circuit. In some embodiments, the closed fluid circuit includes a plurality of TEA nodes (grey filled black outlines) and a plurality of TED nodes (white filled black outlines) that are interconnected by a plurality of capillaries 105. The nodes may take many different geometric forms which may enclose a fluid, e.g. a bi-phase fluid. For example, the nodes may be cavities within a housing structure that are interconnected via other elongate cavities, e.g. capillaries, within the housing structure. It should be appreciated that individual ones of the plurality of capillaries are illustrated in schematic form to show inter-node connections free of any particular geometrical configurations. Furthermore, several of the capillaries are illustrated in dashed form to clearly distinguish between other capillaries (shown in solid lines) which cross there over. In some embodiments, at least some of (or all of) the TEA nodes are directly connected by two or more capillaries to at least two TED nodes, at least three TED nodes, at least four TED nodes, at least five TED nodes, at least six TED nodes, at least seven TED nodes, at least eight TED nodes, at least nine TED nodes, at least ten TED nodes, at least eleven TED nodes, at least twelve TED nodes, at least thirteen TED nodes, at least fourteen TED nodes, at least fifteen TED nodes, at least sixteen TED nodes, at least seventeen TED nodes, at least eighteen TED nodes, at least nineteen TED nodes, or at least twenty TED nodes. Accordingly, a bi-phase fluid that is enclosed within the closed fluid circuit is able to flow through at least one capillary away from each TEA node.

In some embodiments, one or more portions of the thermodynamic system may be disposed adjacent to heat sources and designated as TEA zones. These TEA zones may include a plurality of TEA nodes within close proximity to (e.g., within a threshold distance from), but also isolated from, other TEA nodes with the same TEA zone. For example, nodes may be considered to be in close proximity to one another when several nodes are disposed proximate to a single heat source. However, it should be appreciated that a single heat source may be, for example, a computing component which includes a plurality of smaller heating sources. For example, a processor may include multiple cores each of which may produce heat. In some embodiments, one or more portions of the thermodynamic system may be designated as TED zones each of which include a plurality of TED nodes within close proximity to, but also isolated from, other TED nodes with the same TED zone.

It should be appreciated that the particular internode connections illustrated in FIG. 1 are but one of numerous possible configurations of the systems and apparatuses disclosed herein. Accordingly, the systems and apparatuses disclosed herein may be embodied by numerous other configurations without departing from the scope of the present disclosure.

Figure 2A:
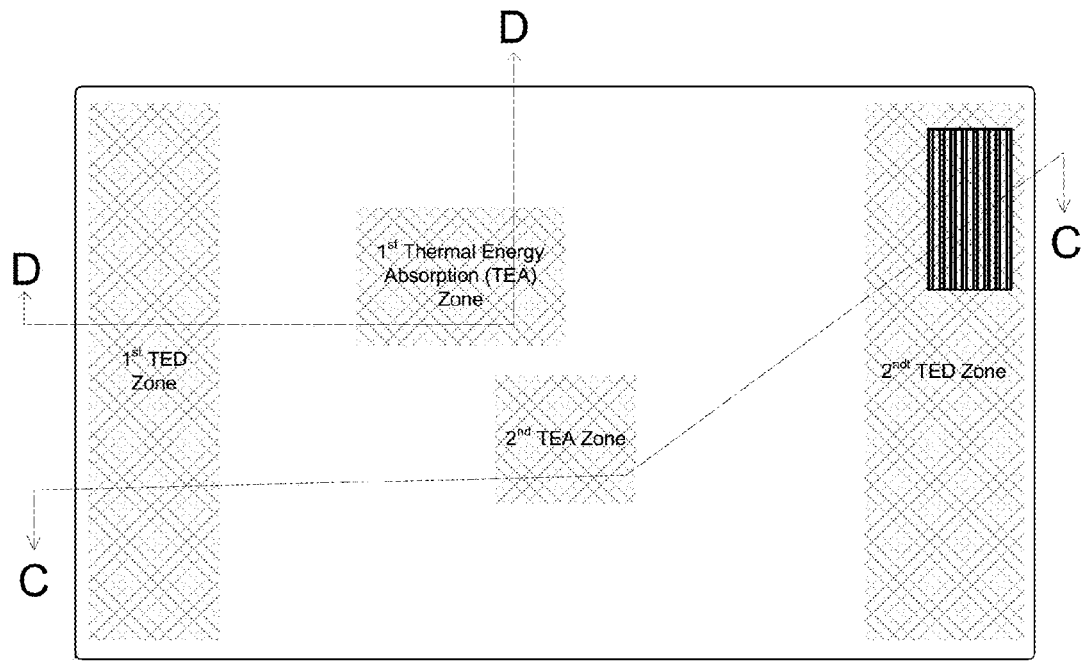
FIG. 2A illustrates a top view of the thermodynamic circuit of FIG. 1.
Figure 2B:
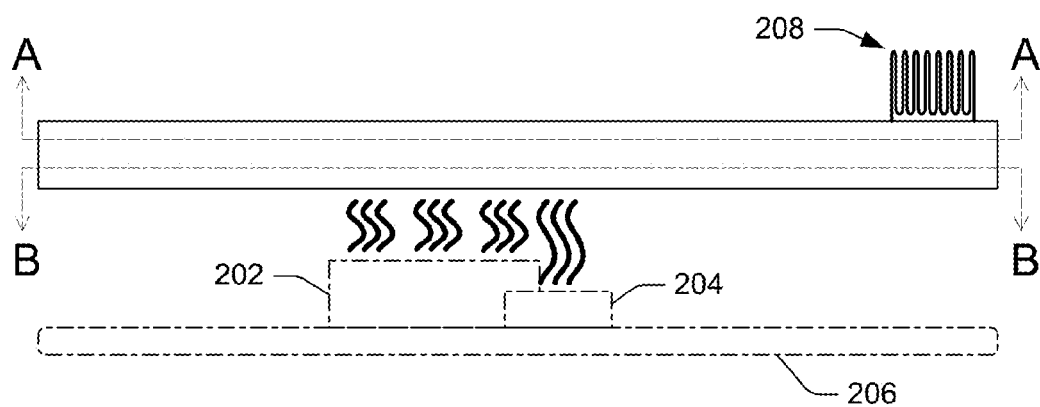
FIG. 2B illustrates a side view of the thermodynamic circuit of FIG. 1 disposed adjacent to a first heat source and a second heat source.

FIG. 2A and FIG. 2B illustrate a top view and a side view, respectively, of the thermodynamic circuit of FIG. 1. With particular reference to FIG. 2B, a first TEA zone that includes a first plurality of TEA nodes is illustrated as being disposed adjacent to a first TE source 202. Furthermore, a second TEA zone that includes a second plurality of TEA nodes is illustrated as being disposed adjacent to a second TE source 204. In some embodiments, the first TE source 202 and the second TE source 204 are affixed to a common base structure 206. Exemplary TE sources that the TE source 202 and the TE source 204 may represent may include heat generating computing components such as, for example, central processing units (CPUs) and/or graphics processing units (GPUs). Furthermore, an exemplary base structure 206 may include a motherboard of a computing device or any similar printed circuit board (PCB).

In some embodiments, the first TE source 202 generates TE at a rate that is at least partially independent of the second TE source 204. For example, in an embodiment in which the first TE source 202 is a CPU and the second TE source 204 is a GPU, each component will generate TE at a rate based on respective current working loads. In particular, respective workloads of a CPU and a GPU may fluctuate over time depending on various programs being run on a computing device that includes each of the CPU and the GPU. Accordingly, during a time period in which the GPU is generating TE at a relatively high rate as compared to the CPU, it may become more critical to transfer TE away from the GPU than the CPU. However, following a change in operational state of one or both of the GPU or CPU, it may become more critical to transfer TE away from the CPU. It is a further object of the present disclosure to self-organize mass transfer of the bi-phase fluid such that TE transfer away from any particular TE source is dynamically responsive to TE generation rates corresponding to those particular TE sources.

In some embodiments, one or more heat dissipation zones include TE conductive protrusions 208. Exemplary TE conductive protrusions include, but are not limited to, fins that extend from the TED zone to increase the rate of heat transfer to or from the environment by increasing convection.

Figure 3A:
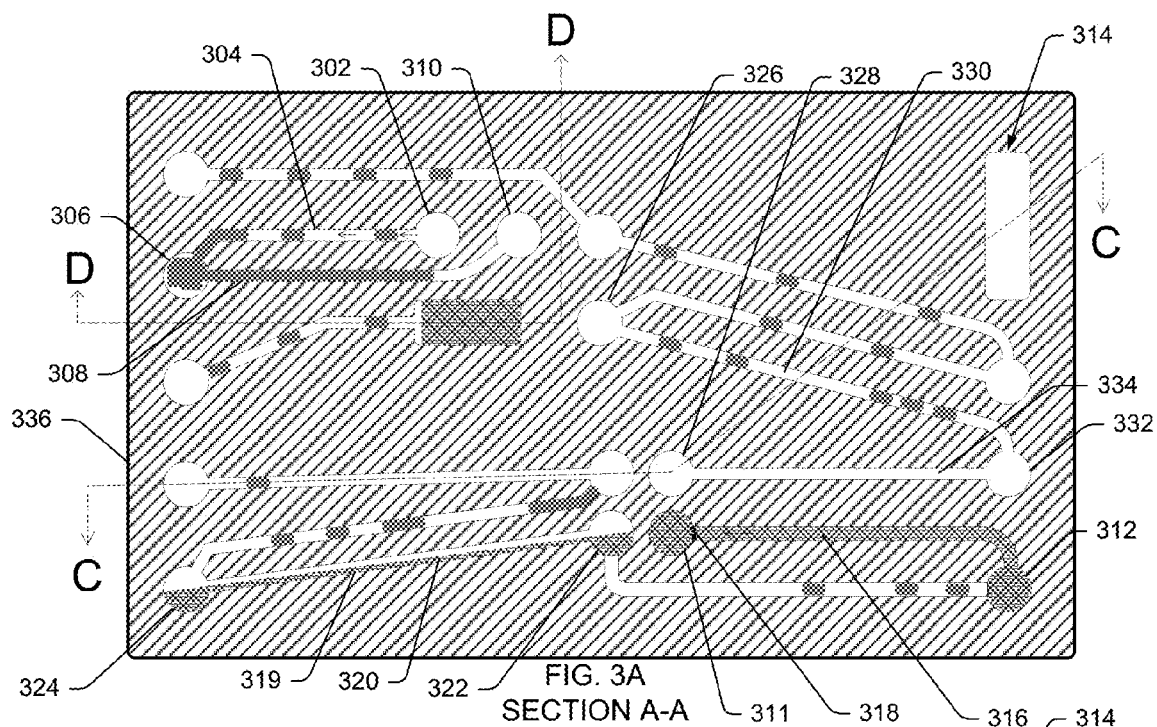
FIG. 3A illustrates a cross-section view of the thermodynamic circuit of FIG. 1, taken along cross-section line A-A.
Figure 3B:
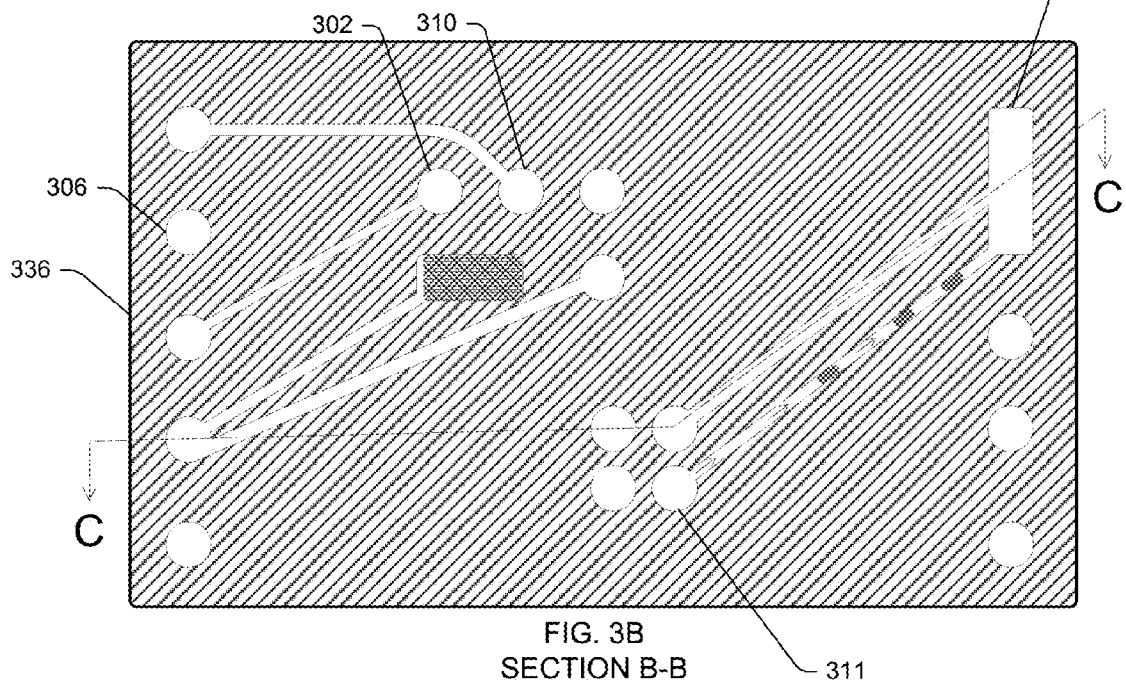
FIG. 3B illustrates a cross-section view of the thermodynamic circuit of FIG. 1, taken along cross-section line B-B.

FIG. 3A illustrates a cross-section view of the thermodynamic circuit of FIG. 1, taken along cross-section line A-A (as shown in FIG. 2B) whereas FIG. 3B illustrates a cross-section view of the thermodynamic circuit of FIG. 1, taken along cross-section line B-B. Accordingly, the capillaries shown in FIG. 3A pass over the top of the capillaries shown in FIG. 3B to interconnect the first plurality of TEA nodes to both of the second plurality of TEA nodes and the TED nodes. As TE is absorbed by the bi-phase fluid at the TEA nodes, the bi-phase fluid may be heated and ultimately vaporized from a liquid state (i.e. a liquid fraction of the bi-phase fluid may be vaporized into a vapor fraction). Furthermore, it should be appreciated that as TE is absorbed into a vapor fraction of the bi-phase fluid at a particular TEA node 302, the temperature of the vapor fraction may rise resulting in an increase in one or both of the pressure or volume of the vapor fraction at the node 302 to expand and push a mass of the bi-phase fluid through a capillary 304 toward a TED node 306 at which TE is dissipated out of the thermodynamic system. It should be appreciated that depending on operating conditions such as, for example, the temperature and pressure of the bi-phase fluid at node 306, vapor fractions of the bi-phase fluid may recondense back into a liquid. The now liquid fraction of the bi-phase fluid may then be forced through another capillary 308 toward a TEA node 310. Furthermore, as TEA node 302 transfers TE toward node 306 it may cool, thereby reducing one or both of the volume or pressure of the bi-phase fluid at node 302 and allowing for oscillation of a portion of the bi-phase fluid back toward the node 310. It should be appreciated that the interconnected nature of the TEA and dissipation nodes through the capillary system allows for mass and TE flow within the closed circuit to self-organize. For example, as TE is absorbed from an external heat source into a particular TEA node then the tendency for the thermodynamic system to transfer TE away from that node increase relative to the other TEA nodes.

In some embodiments, various TEA nodes, TED nodes, and/or capillaries may include a wick structure, e.g. 316 or 320 or 342, at least partially embedded therein. Such a wick structure may draw a liquid fraction of the bi-phase fluid toward one or more TED TEA nodes by a capillary force at an interface between a liquid fraction and a vapor fraction of the bi-phase fluid. Furthermore, in some embodiments this capillary force generated at the interface may continuously force, for at least a limited duration of time while conditions permit, newly vaporized fractions of the bi-phase fluid at a particular TEA node 311 toward a TED node 314. For example, suppose the local conditions at TED node 312 exist such that liquid fractions of the bi-phase fluid at the node remain liquid and vapor fractions recondense. Further suppose that conditions exist at TEA node 311 that liquid fractions of the bi-phase fluid are made to absorb enough TE to vaporize the liquid fractions. Accordingly, as a liquid fraction is drawn through the wick structure 316 it may become vaporized within the wick structure 316 at the interface line 318. Accordingly, as the portion of the wick structure 316 to the left of the interface line 318 is vapor filled and the portion of the wick structure 316 to the right of the interface line 318 is liquid filled, surface tension created at the boundary layer may continually draw the liquid fraction forward thereby further displacing the newly vaporized fraction toward TED node 314. It should be appreciated that although the capillary force of the interface 318 may exert a pressure on the vapor fraction thereby increasing its tendency to flow away as the boundary line advances, local conditions such as pressure, which exist at any particular time at node 314, may overcome this tendency.

In some embodiments, one or more capillaries may include a wick structure embedded within a portion of the whole capillary. For example, capillary 319 is partially filled with a wick structure 320. Furthermore, the combination of the wick structure 320 and the capillary 319 may be configured such that the wick structure 320 may result in a capillary force great enough to draw in any liquid fraction of the bi-phase fluid from the capillary 319 so long as the wick structure contains a vapor fraction which may be displaced to make space for the liquid fraction to be drawn into. For example, as a liquid fraction is vaporized at TEA node 322, an additional portion of the liquid fraction may be drawn into node 322 through the wick structure within capillary 319 while the vaporized fraction may be forced in the opposite direction within capillary 319. Accordingly, a capillary which is partially filled with a wick structure may enable mass transfer, i.e. mass transfer of the bi-phase fluid in liquid and/or vapor form, to occur in both directions simultaneously as a liquid fraction is drawn through the wick structure portion toward a TEA node 322 while a vapor fraction is forced away from TEA node 322 back toward TED node 324.

In some embodiments, one or more TEA nodes is partially filled with a wick structure to draw a liquid fraction of the bi-phase fluid into the node while allowing a vapor fraction to escape from the wick, thereby creating new unsaturated portions of the wick into which the liquid fraction may be further drawn. For example, with particular reference to FIG. 3D, TEA node 340 is illustrate as partially filled with a wick structure 342 such that there is a void area 344 within the node 340. When a liquid fraction 346 of the bi-phase fluid comes into contact with the wick structure 342 the liquid fraction may be drawn into the wick structure, e.g. assuming the wick structure is not already saturated, thereby clearing the liquid fraction out of the capillary 348. As the liquid fraction within the wick structure is vaporized into a vapor fraction as TE is absorbed at the node 340, the pressure and/or volume of the vapor fraction may increase thereby forcing a portion of the vapor fraction out of the node through the capillary 348. It should be appreciated that because the liquid fraction 346 has been absorbed into the wick structure 342 the liquid fraction no long acts as a plug within the capillary 348 blocking the escape of newly vaporized fractions from the node 340. It should be appreciated that the wick structure 342 (or other wick structure configurations disclosed herein) may increase the likelihood of one or more TEA nodes being at least partially filled with a liquid fraction of the bi-phase fluid. It should further be appreciated that allowing any newly vaporized fractions to escape from the TEA nodes while continuously drawing in liquid fractions may increase rate at which the thermodynamic system may absorb TE at the TEA nodes and the rate at which that absorbed TE is allowed to escape to the TED nodes and, ultimately, out of the thermodynamic system into an ambient environment.

In some embodiments, one or more TEA nodes from a first TEA zone, e.g. disposed adjacent to a first heating source, are indirectly connected to a second TEA node from a second TEA zone, e.g. disposed adjacent to a second heating source via one or more capillaries. For example, a first TEA node 326 may be indirectly connected to a second TEA node 328 via a fluid path that includes a first capillary 330 that directly connects the first TEA node 326 to a TED node 332 and also a second capillary 334 that directly connects the TED node 332 to the second TEA node 328. Accordingly, local conditions which exist near a first heating source may impact local conditions which exist near a second heating source. Furthermore, in some embodiments, each TEA node may be interconnected, e.g. at least one or directly or indirectly connected, to each other TEA node and each TED node such that no fraction of the bi-phase fluid is isolated from any other fraction of the bi-phase fluid. Stated alternatively, a flow path exists from each point of the closed fluid path to each other point of the closed fluid path. However, such a path may comprise a single capillary.

Figure 3C:
FIG. 3C illustrates a cross-section view of the thermodynamic circuit of FIG. 1, taken along cross-section line C-C.
Figure 3D:
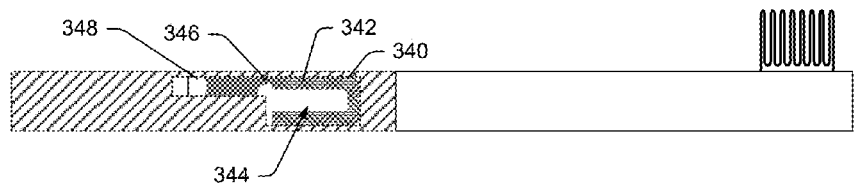
FIG. 3D illustrates a cross-section view of the thermodynamic circuit of FIG. 1, taken along cross-section line D-D.

With particular reference to FIG. 3C, in some embodiments, the plurality of capillaries may include multiple subsets dispersed across multiple layers embedded within a housing. For example, those capillaries disposed along section line A-A and, therefore, illustrated in FIG. 3A are embedded within a first layer of the thermodynamic system housing 336. Furthermore, those capillaries disposed along section line B-B and, therefore, illustrated in FIG. 3B are embedded within a second layer of the housing 336.

In some embodiments, a housing of the thermodynamic system may be non-planar. For example, in some embodiments the nodes (dissipation and/or absorption) and/or the capillaries may be embedded within a housing that is irregularly shaped to conform to a specific application. As but one example, a thermodynamic housing may be designed to conform to an auxiliary power unit including multiple batteries and to transfer TE away from the batteries to one or more remotely located TED zones.

Figure 4A:
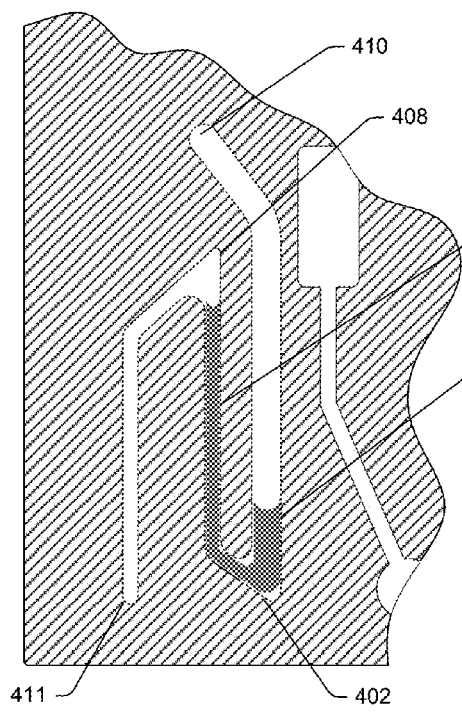
FIG. 4A illustrates a partial cross-section view of a thermodynamic circuit that is similar to the cross-section view of FIG. 3A and that includes two capillaries with differing profile lengths to induce a desired capillary action.

In some embodiments, different capillaries may be configured with different characteristic lengths in order to bias mass movement of the bi-phase fluid toward one or more particular nodes. For example, with particular reference to FIG. 4A, a liquid fraction 402 of the bi-phase fluid filing the thermodynamic system is shown within each of two capillaries 404 and 406 and a TEA node 408. As shown in FIG. 4A, capillary 406 is larger in profile than capillary 404 and, accordingly, the ratio of surface tension generated where the liquid fraction contacts capillary 404 divided by the profile area of capillary 404 will be greater than the ratio of surface tension generated where the liquid fraction contacts capillary 406 divided by the profile area of capillary 406.

Accordingly, it should be appreciated that the bi-phase fluid may be biased toward TEA node 408 as compared to TEA node 410. Furthermore, in some embodiments, capillaries are configured with relative profile lengths in order to bias fluid flow from a first TED node toward a second TED node.

Furthermore, with particular reference to FIG. 4A, in some embodiments, the geometry of one or more of the nodes is similar to the corresponding capillary. For example, node 411 has a geometry which could be milled into a base structure with a single cutting tool, e.g. a milling cutter with a single diameter. FIG. 7 is also included to clarify this point. Moreover, in some embodiments, it may be desirable to space the nodes as closely together as possible and, accordingly, the node geometry may be kept as small as practical based on available manufacturing methods and other design considerations such as product durability to enable both sufficient movement of the bi-phase fluid through the nodes as well as a sufficiently dense spacing of the nodes. Accordingly, it should be appreciated that although the nodes are commonly illustrated as enlarged circular regions, the scope of the disclosure is not limited in this way.

Figure 4B:
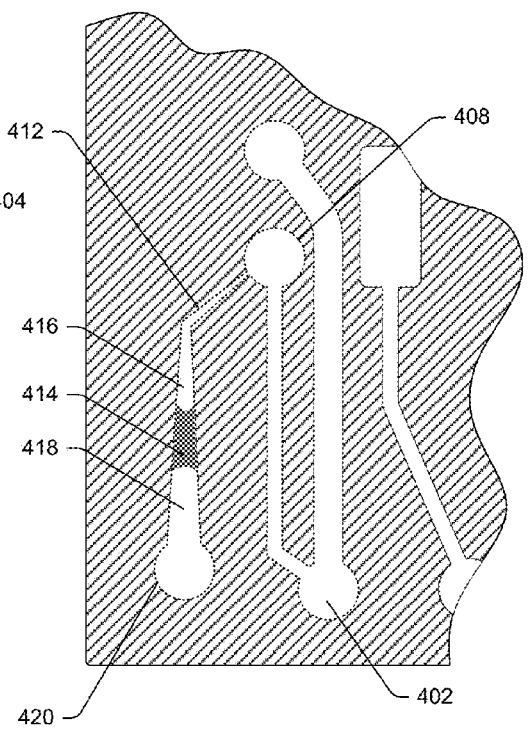
FIG. 4B illustrates a partial cross-section view of a thermodynamic circuit that is similar to the cross-section view of FIG. 3A and that includes two capillaries with differing profile lengths to induce a desired capillary action.

In some embodiments, individual capillaries may be configured to induce fluid flow in a particular direction. For example, with particular reference to FIG. 4B, capillary 412 is configured with a tapered shape such that the pressure created on the boundary between the liquid fraction 414 and the vapor fraction 416 is greater than the pressure created on the boundary between the liquid fraction 414 and the vapor fraction 418. Accordingly, the tapered geometrical configuration of capillary 412 may induce liquid fractions therein to flow away from TED node 420 toward TEA node 408.

Figure 5:
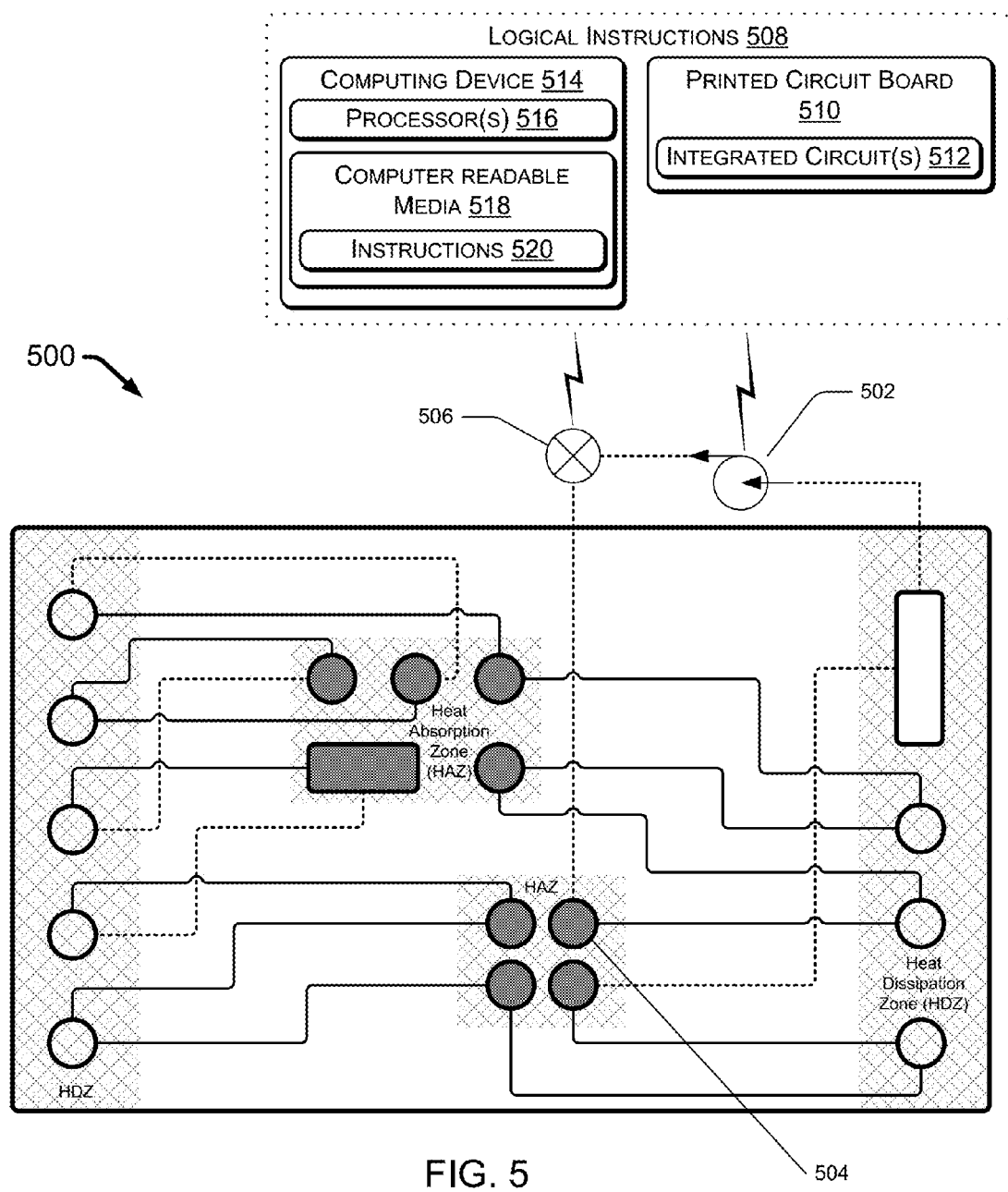
FIG. 5 illustrates a schematic of an example thermodynamic circuit that includes a plurality of interconnected TEA nodes and TED nodes in additional to a pump that is operable to induce a flow of the bi-phase fluid.

Referring now to FIG. 5, in some embodiments a thermodynamic system 500 may include a pump 502 that is operable to perfuse a fraction of the bi-phase fluid in liquid and/or vapor form toward (or away from) a TEA node 504. The pump 502 may be external to or integrated within a housing of the thermodynamic system. Accordingly, while some embodiments of the systems and apparatuses disclosed herein may be in a passive configuration, other embodiments such as those which include a pump 502 may be in an active configuration such that external power is consumed to increase TE transfer away from one or more TEA nodes. In some embodiments, the thermodynamic system 500 may further include a sensor 506 configured to indicate one or more properties of the thermodynamic system 500. Exemplary sensors include, but are not limited to, pressure sensors and temperature sensors. In some embodiments, the system 500 may further include logical instructions 508 configured to control the pump 502. For example, in an embodiment wherein the sensor 506 is a pressure sensor, the logical instructions may be configured to cause the pump to operate based on an internal pressure of the system 500 reaching or exceeding a predetermined threshold. It should be appreciated that due to the bi-phase nature of the fluid and that typically an increase in pressure may correspond to an increase in temperature, e.g. as the volume of closed fluid circuit of the system 500 may remain constant. Accordingly, in some embodiments a pressure sensor may be used in lieu of a temperature sensor which may provide for the advantage of being less dependent on the sensor placement location. For example, a pressure reading may be taken at a location within the system distant from any particular TEA node and the resulting reading may be used to infer information about the current temperatures within the system near the TEA nodes. Furthermore, the logical instructions may be configured to cause the pump to remain operational until such time that the pressure reading drops below a different threshold that is less than the threshold which causes initiation of the pump.

In some embodiments, the logical instructions 508 may be encoded onto a printed circuit board 510 that includes one or more integrated circuits 512. Some advantages of including the instructions on an integrated circuit/printed circuit board combination may relate to design packaging considerations and the relatively inexpensive nature of mass production of these types of circuits. In some embodiments, the logical instructions 508 may be stored as computer-readable instructions 520 on one or more computer readable media 518 of a computing device 514. Accordingly, the instructions 520 may be executable by one or more processors 516 of the computing device 514. Furthermore, in some embodiments the processor(s) 516 actually executing the logical instructions 520 that control one or more components and/or operations of the thermodynamic system 500 may also be one of the heating sources which the thermodynamic system 500 may be configured to transfer TE away from.

Figure 6A:
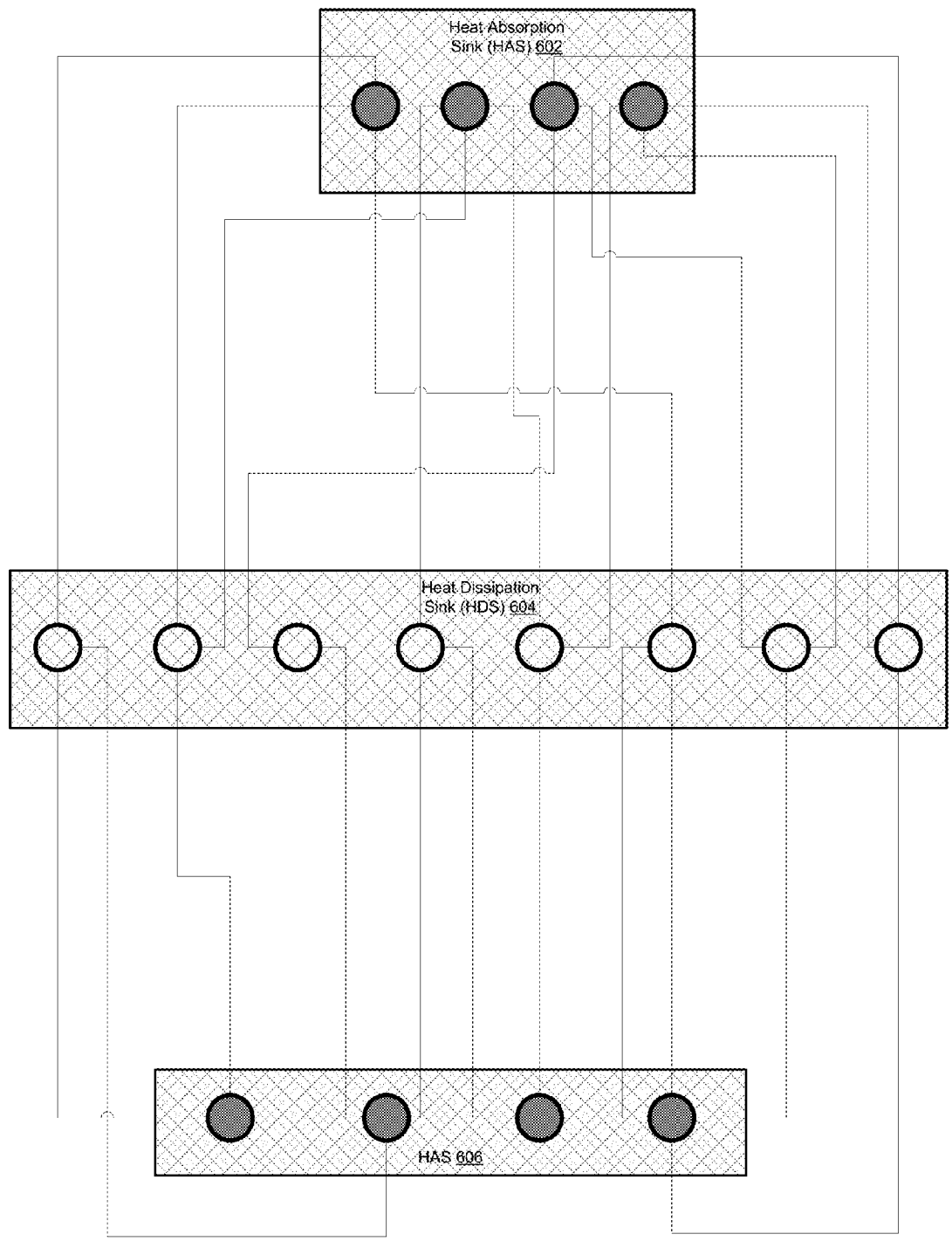
FIG. 6A illustrates an example thermodynamic circuit that includes a first TEA sink and a second TEA sink which are non-contiguous from one another.
Figure 6B:
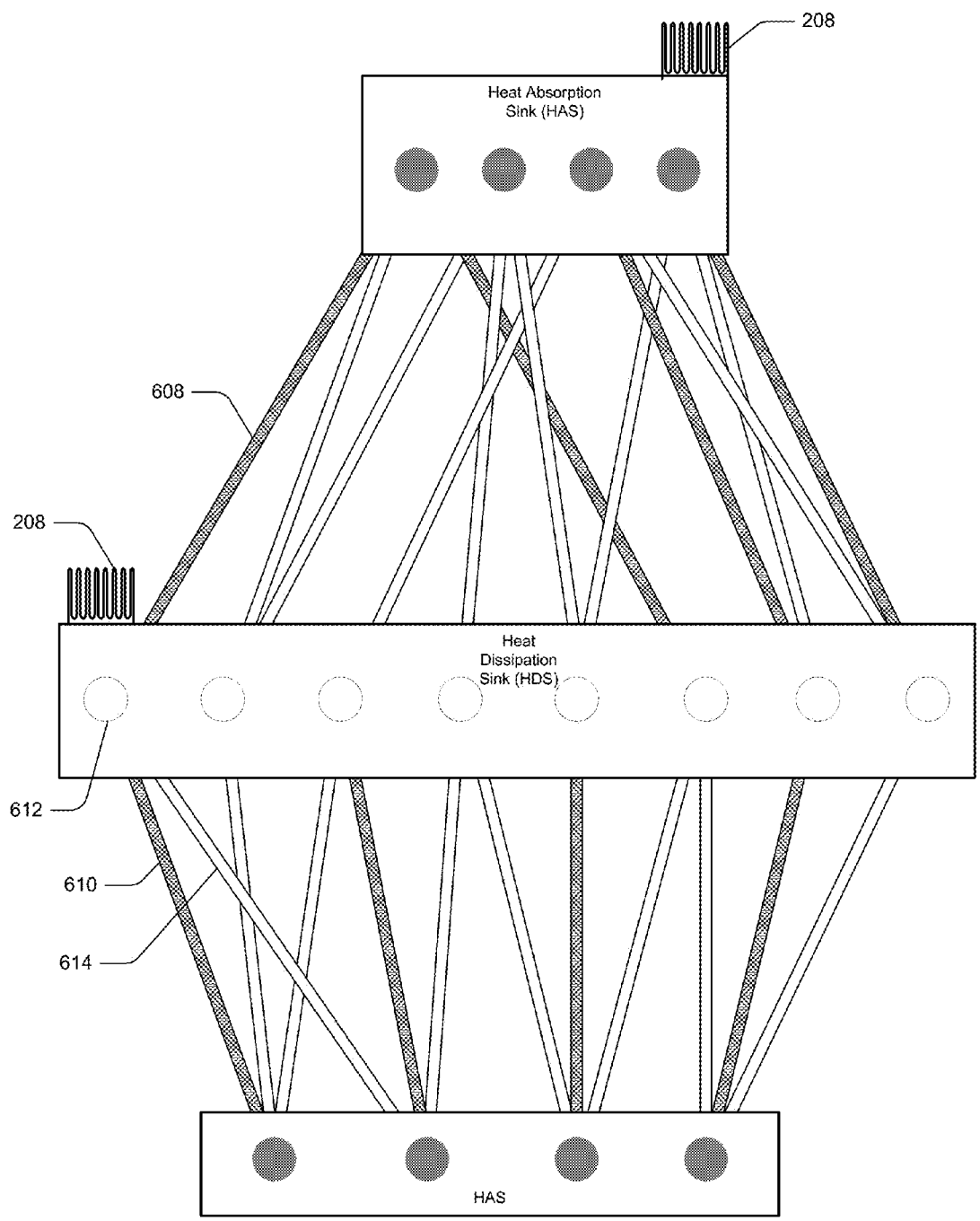
FIG. 6B illustrates an example thermodynamic circuit that includes a first TEA sink and a second TEA sink which are non-contiguous from one another.

Referring now to FIGS. 6A and 6B, in some embodiments, a thermodynamic system 600 includes a first TEA sink 602 that includes a first plurality of TEA nodes (grey filled black outlines) enclosing the bi-phase fluid and a second TEA sink 606 that includes a second plurality of TEA nodes (grey filled black outlines) wherein the first and second pluralities of TEA nodes are interconnected through at least one TED sink 604 that includes a plurality of TED nodes (white filled black outlines). Furthermore, in some embodiments, the first TEA sink 602 may be non-contiguous to the second TEA sink 606. Referring now to particularly to FIG. 6B, in some embodiments, the respective nodes of the first TEA sink 602 and the second TEA sink 606 and the at least one TED sink 604 are interconnected by a plurality of capillary tubes (not individually labeled) that correspond to the schematic diagram of FIG. 6A. It should be appreciated that similar to a plurality of capillaries embedded into a housing (e.g. channels milled or otherwise formed into the housing) the plurality of capillary tubes may form a closed circuit enclosing the bi-phase fluid. Furthermore, in some embodiments, the nodes may be completely interconnected such that no fraction of the bi-phase fluid is isolated from any other fraction of the bi-phase fluid.

In some embodiments, at least some of the plurality of capillary tubes may include a wick structure 608 that draws one or more liquid fractions of the bi-phase fluid toward at least some of the TEA nodes. For example, both of capillaries 608 and 610 may include a wick structure that draws liquid fractions away from TED node 612 while capillary 614 is void of any wick structure and, therefore, is relatively more prone to allowing a vapor fraction of the bi-phase fluid to flow to node 612.

In some embodiments, at least some of the capillary tubes are flexible in nature to allow for relative movement of one or more of the first TEA sink 602, the second TEA sink 606, or the at least one TED sink 604 with respect to one another. For example, the capillary tubes may be constructed of a high temperature graded flexible plastic tubing and the various TE sinks may be disposed adjacent to multiple heat sources which, during operation, may move with respect to one another. It should be appreciated that various types of machinery may be exemplary environments to include the thermodynamic system 600 within.

In some embodiments, one or more of the TEA or TED sinks may include TE conductive protrusions 208. Exemplary TE conductive protrusions include, but are not limited to, fins that extend from the TED zone to increase the rate of heat transfer to or from the environment by increasing convection.

Figure 7A:
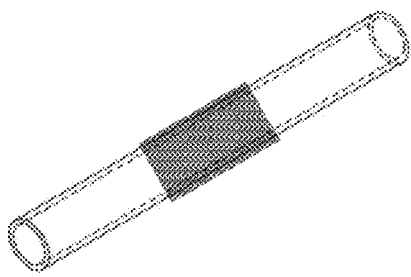
FIG. 7A illustrates an exemplary node configuration in accordance with some embodiments.
Figure 7B:
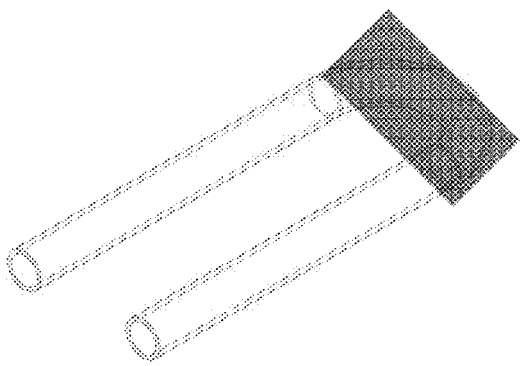
FIG. 7B illustrates an exemplary node configuration in accordance with some embodiments.
Figure 7C:
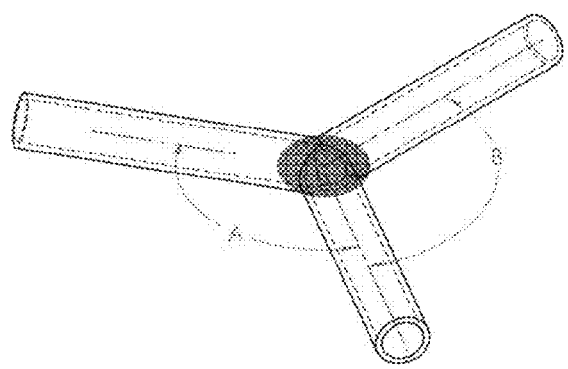
FIG. 7C illustrates an exemplary node configuration in accordance with some embodiments.

Referring now to FIGS. 7A-7C, it should be appreciated that the various TE nodes described herein may be embodied in various geometrical configurations. In particular, while the TE nodes may in some embodiments be geometrically configured as shown in the illustrations herein, they may also take many other geometrical forms. Exemplary geometrical forms include, but are not limited to, those shown in FIGS. 7A-7C. In particular, the nodes may be representative of a particular straight section of a capillary or capillary tube as shown in FIG. 7A, or a particular curved section of a capillary or capillary tube as shown in FIG. 7B, or a particular joint between two or more of capillaries or capillary tubes as shown in FIG. 7C.

Figure 8:
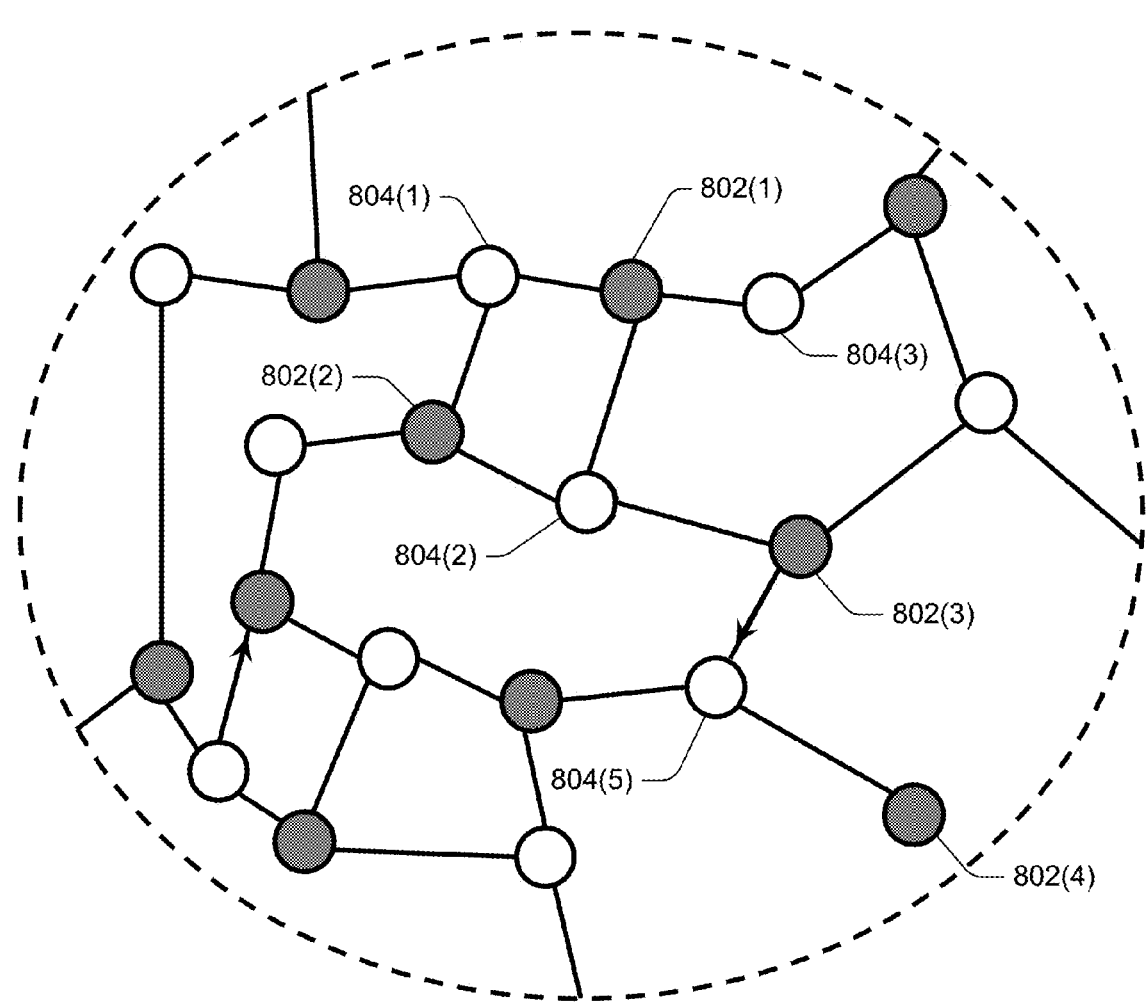
FIG. 8 illustrates a schematic of exemplary thermodynamic circuit that includes a plurality of interconnected thermal energy absorption (TEA) nodes and TE dissipation (TED) nodes in accordance with some embodiments.

With particular reference to FIG. 8, in some embodiments a self-organizing thermodynamic circuit 800 may include a plurality of TEA nodes 802 (grey filled black outlines) that are interconnected to a plurality of TED nodes 804 (white filled black outlines) by a plurality of capillaries (black lines).

In some embodiments, the plurality of TEA nodes 802 enclosing the bi-phase fluid include at least a first TEA node 802(1), a second TEA node 802(2), and a third TEA node 802(3) and also the plurality of TED nodes 804 may include at least a first TED node 804(1), a second TED node 804(2), and a third TED node 804(3). Furthermore, in some embodiments, the plurality of capillaries may interconnect the nodes such that the first TEA node is directly connected to each of the first, second, and third TED nodes 804(1)-(3). Accordingly, in some embodiments, individual TEA nodes may be directly connected to three or more TED nodes. Similarly, in some embodiments, individual TED nodes may be directly connected to three or more TEA nodes. For example, as illustrated in FIG. 8, the plurality of capillaries may further directly connect at least the second TED node to at least the second TEA node and the third TEA node. Furthermore, in some embodiments, one or more capillaries has a dedicated path flow direction as indicated by the arrow headed capillaries of FIG. 8. For example, one or more capillaries may include a check valve to restrict flow exclusively to one direction. In some embodiments, one or more TEA nodes and/or one or more TED nodes are connected by a capillary to only a single other node, e.g. the pathway to the node leads to a "dead-end." For example, TEA node 802(4) connects within the network to only a single other node, e.g. TED node 804(5). In some embodiments, one or more dead-end nodes are connected another node by a capillary that is partially filled with a wick structure to draw a liquid fraction of the bi-phase fluid toward the node while allowing a vapor fraction of the bi-phase fluid to escape from the node.

Figure 9:
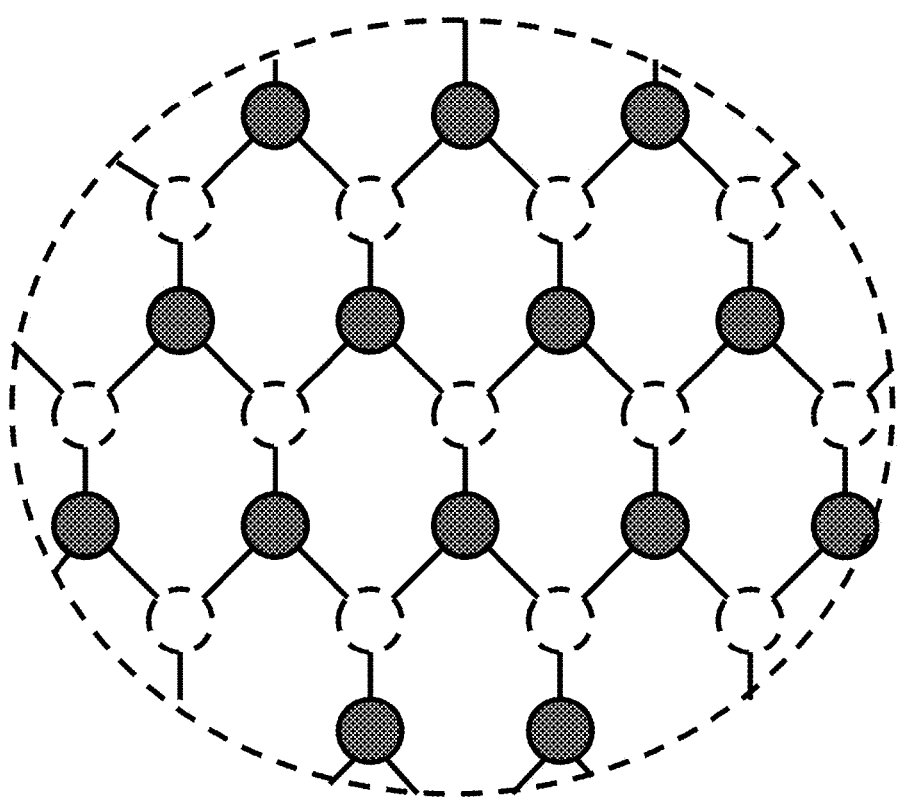
FIG. 9 illustrates a schematic of exemplary thermodynamic circuit that includes a plurality of interconnected thermal energy absorption (TEA) nodes and TE dissipation (TED) nodes in accordance with some embodiments.
Figure 10:
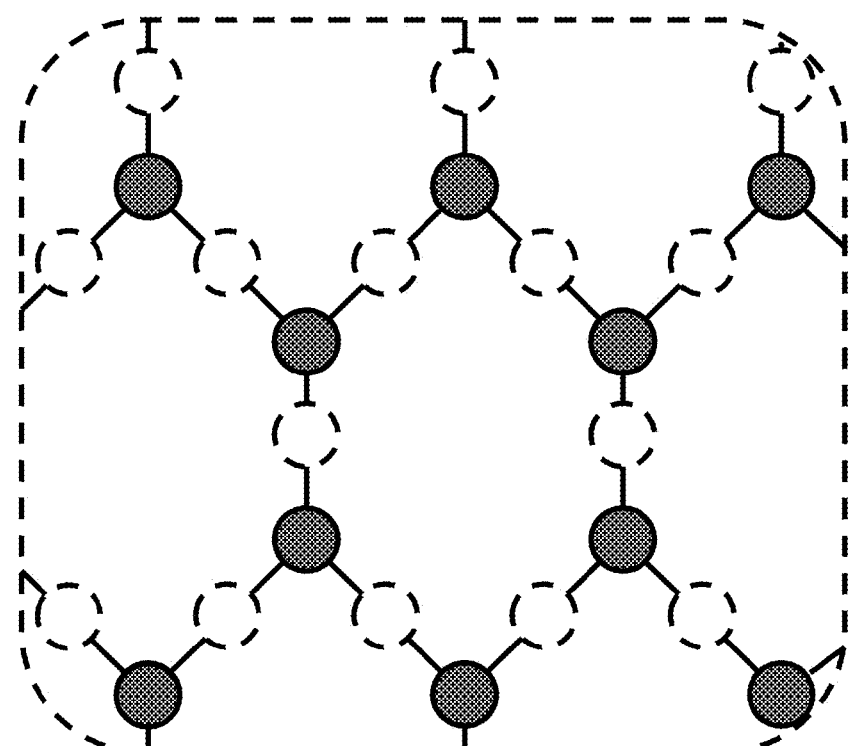
FIG. 10 illustrates a schematic of exemplary thermodynamic circuit that includes a plurality of interconnected thermal energy absorption (TEA) nodes and TE dissipation (TED) nodes in accordance with some embodiments.
Figure 11:
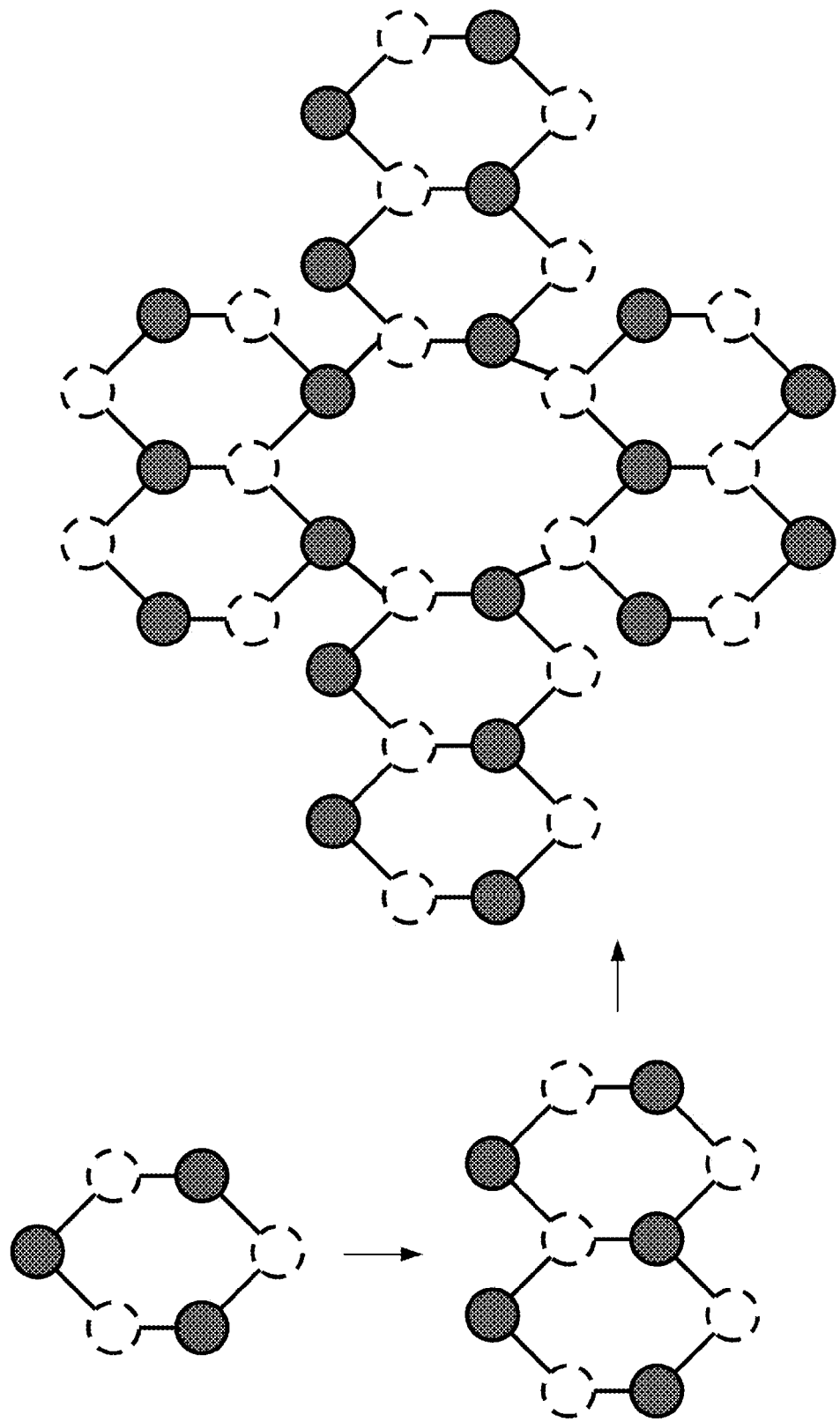
FIG. 11 illustrates a schematic of exemplary thermodynamic circuit that includes a plurality of interconnected thermal energy absorption (TEA) nodes and TE dissipation (TED) nodes in accordance with some embodiments.

Referring now to FIGS. 9-11, various thermodynamic system schematics are illustrated showing exemplary arrangements for interconnections of the TEA nodes to the TED nodes through the plurality of capillaries. It should be appreciated that each of the figures presented and described herein are for exemplary purposes only to effectively convey the inventive concept(s). Accordingly, numerous other configurations are clearly within the scope of the present disclosure. In some embodiments, at least some individual TEA nodes are not directly connected to any other TEA node and at least some individual TED nodes are not directly connected to any other TED node, e.g. at least some nodes have no direct capillary connections to like nodes. In some embodiments, none of the TEA nodes or TED nodes have any direct capillary connections to like nodes.

Figure 12:
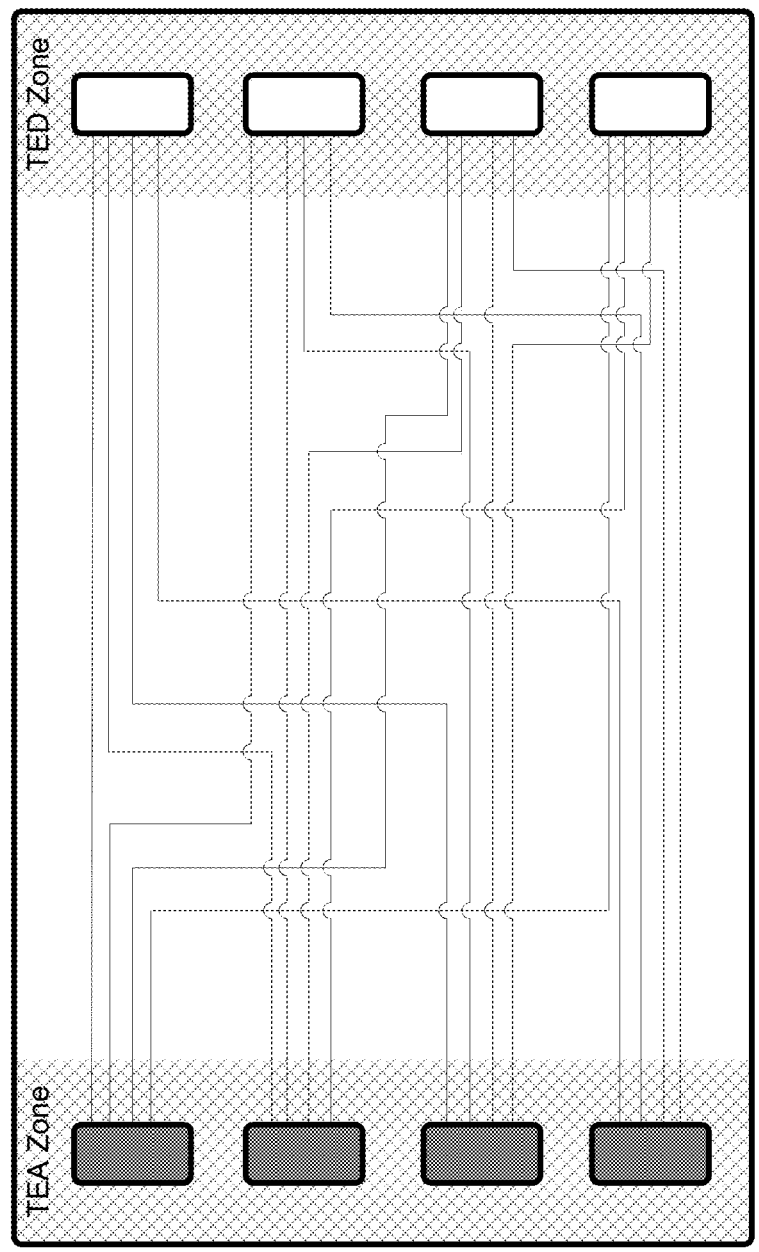
FIG. 12 illustrates a schematic of an example thermodynamic circuit that includes a plurality of interconnected TEA nodes and TED nodes according to some embodiments.

FIG. 12 illustrates a schematic of an example thermodynamic circuit that includes at least four interconnected TEA nodes and TED nodes according to some embodiments. In the embodiment illustrated in FIG. 12, the thermodynamic circuit includes four TEA nodes and four TED nodes and is arranged with complete interconnectivity, e.g. each TEA node is directly connected to each TED node. In some embodiments, a thermodynamic circuit with complete interconnectivity includes five TEA nodes, six TEA nodes, seven TEA nodes, eight TEA nodes, nine TEA nodes, or ten TEA nodes. In some embodiments, a thermodynamic circuit with complete interconnectivity includes five TED nodes, six TED nodes, seven TED nodes, eight TED nodes, nine TED nodes, or ten TED nodes.

As illustrated elsewhere herein, in some embodiments, the plurality of capillaries are dispersed over multiple levels within a plate. For example, for ease of manufacturing the embodiment illustrated schematically in FIG. 12 may include four planar (or non-planar for that matter) layers of capillaries. In preferred embodiments, TEA nodes are directly connected only to TED nodes and vice versa, e.g. TEA nodes are not directly connected to other TEA nodes. Moreover, in some embodiments, the whole network is well connected such that there is no a sub-group of nodes having zero connection to any other subgroup of nodes. In present disclosure, a particular thermodynamic circuit's topology may be classified in terms of connection ratios as:

$$\frac{\text{Number of Capillaries Connecting to TEA Nodes}}{\text{Number of TEA Nodes}} : \frac{\text{Number of Capillaries Connecting to TED Nodes}}{\text{Number of TED Nodes}}.$$

In some embodiments, a thermodynamic circuit's topology is preferably no less than 2/1:2/1 e.g. the TEA and TED nodes connect to at least two counterpart nodes. These subzones/nodes and corresponding connections represent freedoms of the whole dynamic system, and their layout is determined only by the criteria of ensuring the thermodynamic system critically self-organized.

In some embodiments, a self-organizing thermodynamic system includes one TEA zone and one TED zone wherein the one TEA zone includes four or more TEA nodes and the one TED zone includes four or more TED nodes. In such an embodiment, at least some of the TEA nodes may be interconnected to at least three TED nodes, at least four TED nodes, at least five TED nodes, at least six TED nodes, at least seven TED nodes, at least eight TED nodes, at least nine TED nodes, and/or at least ten TED nodes. Furthermore, in such an embodiment, at least some of the TED nodes may be interconnected to at least three TEA nodes, at least four TEA nodes, at least five TEA nodes, at least six TEA nodes, at least seven TEA nodes, at least eight TEA nodes, at least nine TEA nodes, and/or at least ten TEA nodes.

In some embodiments, a self-organizing thermodynamic system includes two TEA zones and two TED zones wherein at least one of the TEA zones includes four or more TEA nodes and at least one of the TED zones includes four or more TED nodes. In such an embodiment, at least some of the TEA nodes may be interconnected to at least three TED nodes, at least four TED nodes, at least five TED nodes, at least six TED nodes, at least seven TED nodes, at least eight TED nodes, at least nine TED nodes, and/or at least ten TED nodes. Furthermore, in such an embodiment, at least some of the TED nodes may be interconnected to at least three TEA nodes, at least four TEA nodes, at least five TEA nodes, at least six TEA nodes, at least seven TEA nodes, at least eight TEA nodes, at least nine TEA nodes, and/or at least ten TEA nodes.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A thermodynamic system comprising:
   a first plurality of thermal energy absorption (TEA) nodes, individual TEA nodes of the first plurality of TEA nodes enclosing a bi-phase fluid, the first plurality of TEA nodes being included within a first TEA zone that is disposed adjacent to a first thermal energy (TE) source;
   a second plurality of TEA nodes, individual TEA nodes of the second plurality of TEA nodes enclosing the bi-phase fluid, the second plurality of TEA nodes being included within a second TEA zone that is disposed adjacent to a second TE source, wherein the second TE source generates TE at least partially independently of the first TE source;
   a first plurality of thermal energy dissipation (TED) nodes, individual TED nodes of the first plurality of TED nodes enclosing the bi-phase fluid, the first plurality of TED nodes being included within a first thermal energy dissipation (TED) zone; and
   a plurality of capillaries interconnecting, to form a closed fluid circuit, the first plurality of TEA nodes to both of the second plurality of TEA nodes and the first plurality of TED nodes.

2. The thermodynamic system of claim 1, further comprising a wick structure embedded within at least a first capillary of the plurality of capillaries that draws, by a capillary force at an interface between a liquid fraction of the bi-phase fluid and a vapor fraction of the bi-phase fluid, the liquid fraction from a first TED node to a TEA node at which the liquid fraction becomes vaporized into the vapor fraction, wherein the capillary at the interface forces the vapor fraction toward a second TED node through at least a second capillary.

3. The thermodynamic system of claim 1, further comprising a wick structure embedded within a first portion of at least a first capillary of the plurality of capillaries, wherein the first capillary further includes a second portion that is void of the wick structure, and wherein each of the first portion and the second portion extend from a TEA node to a TED node.

4. The thermodynamic system of claim 1, wherein a first TEA node that is adjacent to the first TE source is indirectly connected to a second TEA node that is adjacent to the second TE source via a fluid path comprising:
   a first capillary of the plurality of capillaries that directly connects the first TEA node to a first TED node; and
   a second capillary of the plurality of capillaries that directly connects the first TED node to the second TEA node.

5. The thermodynamic system of claim 1, wherein the first TE source is a first computing component of a computing system and the second TE source is a second computing component of the computing system.

6. The thermodynamic system of claim 1, wherein a first subset of the plurality of capillaries are embedded within a first layer of a housing and a second subset of the plurality of capillaries are embedded within a second layer of the housing.

7. The thermodynamic system of claim 1, wherein the plurality of capillaries comprise:
   a first capillary that connects a first TED node to a first TEA node, the first capillary having a first profile length; and
   a second capillary that connects the first TEA node to a second TED node that is further connected to a second TEA node, the second capillary having a second profile length that is greater than the first characteristic profile length such that a flow of the bi-phase fluid is biased from the first TED node toward the second TED node.

8. The thermodynamic system of claim 1, wherein each TEA node is interconnected with each other TEA node and each TED node such that no fraction of the bi-phase fluid is isolated from any other fraction of the bi-phase fluid.

9. The thermodynamic system of claim 1, further comprising a pump that is operable to perfuse a fraction of the bi-phase fluid from a first TED node, at the first TED zone, to a second TED node, at a second TED zone that includes a second plurality of TED nodes, through a first TEA node at the first TEA zone.

10. The thermodynamic system of claim 9, further comprising:
    a pressure sensor that is operable to indicate an internal pressure corresponding to the bi-phase fluid within the closed fluid circuit, the internal pressure being at least partially dependent on a temperature of a vapor-fraction of the bi-phase fluid; and
    logical instructions maintained in a memory and configured, upon execution by a processor, to cause the pump to operate, based on the internal pressure reaching or exceeding a first predetermined threshold, until the internal pressure falls below a second predetermined threshold that is less than the first predetermined threshold.

11. The thermodynamic system of claim 1, wherein at least one TEA node enclosing the bi-phase fluid is partially filled with a wick structure that draws, by a capillary force at an interface between a liquid fraction of the bi-phase fluid and a vapor fraction of the bi-phase fluid, the liquid fraction into the at least one TEA node while allowing the vapor fraction to escape through one or more of the plurality of capillaries.

12. The thermodynamic system of claim 1, wherein:
    the first plurality of TEA nodes are housed in a first TEA sink;
    the second plurality of TEA nodes are housed in a second TEA sink that is non-contiguous to the first TEA sink;
    the first plurality of TED nodes are housed in at least one TED sink; and
    the plurality of capillaries are a plurality of capillary tubes interconnecting, to form the closed fluid circuit, the first plurality of TEA nodes to both of the second plurality of TEA nodes and the first plurality of TED nodes.

13. The thermodynamic system of claim 12, wherein at least one capillary tube of the plurality of capillary tubes includes a wick structure that draws one or more liquid fractions of the bi-phase fluid toward at least one TEA node of the first plurality of TEA nodes, or the second plurality of TEA nodes, or both.

14. The thermodynamic system of claim 13, wherein a first TEA node of the first plurality of TEA nodes are interconnected to at least a first capillary tube of the plurality of capillary tubes that includes the wick structure and at least a second capillary tube of the plurality of capillary tubes that is void of the wick structure.

15. The thermodynamic system of claim 12, wherein at least one capillary tube of the plurality of capillary tubes is at least partially flexible such that the at least one TED sink is at least partially movable with respect to at least one of the first TEA sink or the second TEA sink.

16. The thermodynamic system of claim 12, wherein at least one of the first TEA sink, the second TEA sink, or the at least one TED sink includes a plurality of TE conductive protrusions.

17. The thermodynamic system of claim 1, wherein:
at least one of the first plurality of TEA nodes or the second plurality of TEA nodes includes at least a first TEA node, a second TEA node, and a third TEA node;
the first plurality of TED nodes includes at least a first TED node, second TED node, and a third TED node; and
the plurality of capillaries directly connects at least the first TEA node to at least the first TED node, the second TED node, and the third TED node.

18. The thermodynamic system of claim 17, wherein the plurality of capillaries further directly connect at least the second TED node to at least the second TEA node and the third TEA node.

19. The thermodynamic system of claim 17, wherein at least a first capillary of the plurality of capillaries is tapered toward at least the first TEA node to induce a first liquid fraction of the bi-phase fluid to flow toward at least the first TEA node.

20. The thermodynamic system of claim 17, wherein at least a second capillary of the plurality of capillaries is tapered toward at least the first TED node to induce a second liquid fraction of the bi-phase fluid to flow toward at least the first TED node.

* * * * *